United States Patent
Soldi et al.

(10) Patent No.: US 8,471,584 B2
(45) Date of Patent: Jun. 25, 2013

(54) SWITCHING DEVICE FAILURE DETECTION SYSTEM AND METHOD FOR MULTILEVEL CONVERTERS

(75) Inventors: Paolo Soldi, Munich (DE); Robert Roesner, Unterfoehring (DE); Stefan Schroeder, Munich (DE)

(73) Assignee: General Electric Company, Niskayuna, NY (US)

(*) Notice: Subject to any disclaimer, the term of this patent is extended or adjusted under 35 U.S.C. 154(b) by 428 days.

(21) Appl. No.: 12/789,513

(22) Filed: May 28, 2010

(65) Prior Publication Data

US 2011/0140727 A1    Jun. 16, 2011

(51) Int. Cl.
*G01R 31/26* (2006.01)
(52) U.S. Cl.
USPC .................................. 324/762.01
(58) Field of Classification Search
USPC .. 324/762.01–762.1, 764.01, 765.01; 363/97, 363/50, 131
See application file for complete search history.

(56) References Cited

U.S. PATENT DOCUMENTS

| | | | |
|---|---|---|---|
| 3,852,656 A | 12/1974 | Bourbeau | |
| 6,058,031 A * | 5/2000 | Lyons et al. | 363/67 |
| 7,489,487 B2 * | 2/2009 | Oka | 361/79 |
| 2007/0159749 A1 | 7/2007 | Oka | |

FOREIGN PATENT DOCUMENTS

EP    0010811 A1    5/1980

* cited by examiner

*Primary Examiner* — Tung X Nguyen
(74) *Attorney, Agent, or Firm* — Nitin Joshi

(57) ABSTRACT

A multilevel converter includes a plurality of phase legs each having at least two inner switching devices, at least two outer switching devices, at least two clamping diodes, a split DC link and a switching device failure detection circuit. The switching device failure detection circuit includes a logic module for each of the switching devices, a voltage calculation module and a failure detection algorithm. The logic module generates a blocking state logic signal by comparing a switching device voltage and a threshold reference voltage and the voltage calculation module determines an expected voltage blocking state for each of the switching devices based on the gate drive signals of the switching devices and an output current direction. The failure detection algorithm detects a failure condition in any of the switching devices based on the blocking state logic signals and the expected voltage blocking states of the switching devices.

16 Claims, 7 Drawing Sheets

SWITCHING DEVICE FAILURE DETECTION SYSTEM AND METHOD FOR MULTILEVEL CONVERTERS

BACKGROUND

This invention relates to a method for detection of switching device failure conditions in a multilevel converter.

Multilevel converters (e.g. neutral point clamped converters) are generally used in high power industrial applications such as variable speed drive (VSD) systems or in energy conversion applications such as a solar (or photovoltaic) power generation systems, wind turbine generators or marine and hydrokinetic power generation systems. The general function of the multilevel converter is to synthesize a sinusoidal voltage by several levels of voltages, typically obtained from capacitor voltage sources. A three level converter includes two capacitor voltages in series with the center tap as the neutral. Each phase leg of the three-level converter has two pairs of switching devices in series. The switching device is bidirectional in current, often realized as anti-parallel connection of a unidirectional electronic switching device (e.g. IGBT, IGCT) and a diode (free-wheeling diode).

The switching devices in a multilevel converter receive high electrical and thermal stress during short-circuit conditions or during turn-off switching of a clamped inductive load. For example if there is large power loss within the switching device due to electrical stress or overcurrent, the switching device overheats and it may lead to thermal breakdown of the switching device. Similarly, when an inductive load or inductive current is switched off, the switching device may observe overvoltage resulting into voltage breakdown of the switching device. Once a switching device is broken down or destroyed due to overheat or overvoltage, without protective measures, a chain reaction may occur resulting into destruction of the entire multilevel converter bridge. Thus, it is important to detect failures in switching devices in multilevel converters. One example of a measurement used for detecting switching device failure in IGBT converters is a desaturation circuit. However, methods using the desaturation circuit detect a failure condition only when the corresponding switching device is turned ON and do not provide any signal when the gate drive signal to the switching device is turned OFF. Thus, the desaturation circuit does not detect all possible short-circuit failure conditions.

Therefore, it is desirable to provide a method and a system that will address the foregoing issues.

BRIEF DESCRIPTION

In accordance with an embodiment of the present invention, a multilevel converter with a plurality of phase legs each having at least two inner switching devices, at least two outer switching devices, at least two clamping diodes and a split DC link is provided. The multilevel converter also includes a switching device failure detection circuit including a logic module for each of the switching devices to generate a blocking state logic signal by comparing a switching device voltage and a threshold reference voltage. The switching device failure detection circuit also includes a voltage calculation module to determine an expected voltage blocking state for each of the switching devices based on the gate drive signals of the switching devices and an output current direction. The switching device failure detection circuit further includes a failure detection algorithm to detect a failure condition in any of the switching devices based on the blocking state logic signals and the expected voltage blocking states of the switching devices.

In accordance with another embodiment of the present invention, a multilevel converter with a plurality of phase legs each having at least two inner switching devices, at least two outer switching devices, at least two clamping diodes and a split DC link is provided. The multilevel converter also includes a switching device failure detection circuit with a voltage calculation module to determine an expected output voltage at phase terminals of phase legs based on gate drive signals of switching devices and an output current direction and a failure detection algorithm to detect a failure condition in any of the switching devices by comparing the expected output voltage with an actual output voltage.

In accordance with an embodiment of the present invention, a method of determining a failure condition in switching devices of a multilevel converter comprising a split DC link and a plurality of phase legs each having at least two inner switching devices, at least two outer switching devices, at least two clamping diodes is provided. The method includes determining an expected voltage blocking state for each of the switching devices based on gate drive signals of the switching devices and an output current direction and generating a blocking state logic signals by comparing terminal voltages across the switching devices and a threshold reference voltage. The method also includes detecting failure conditions in the switching devices based on the blocking state logic signals and the voltage blocking states for the switching devices.

In accordance with yet another embodiment of the present invention, a switching device failure detection circuit for a multilevel converter comprising a split DC link and a plurality of phase legs each having at least two inner switching devices, at least two outer switching devices and at least two clamping diodes is provided. The switching device failure detection circuit includes a logic module for each of the switching devices to generate a blocking state logic signal by comparing a switching device voltage and a threshold reference voltage. The switching device failure detection circuit also includes a voltage calculation module to determine an expected voltage blocking state for each of the switching devices based on the gate drive signals of the switching devices and an output current direction. The switching device failure detection circuit further includes a failure detection algorithm to detect a failure condition in any of the switching devices based on the blocking state logic signals and the expected voltage blocking states of the switching devices.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
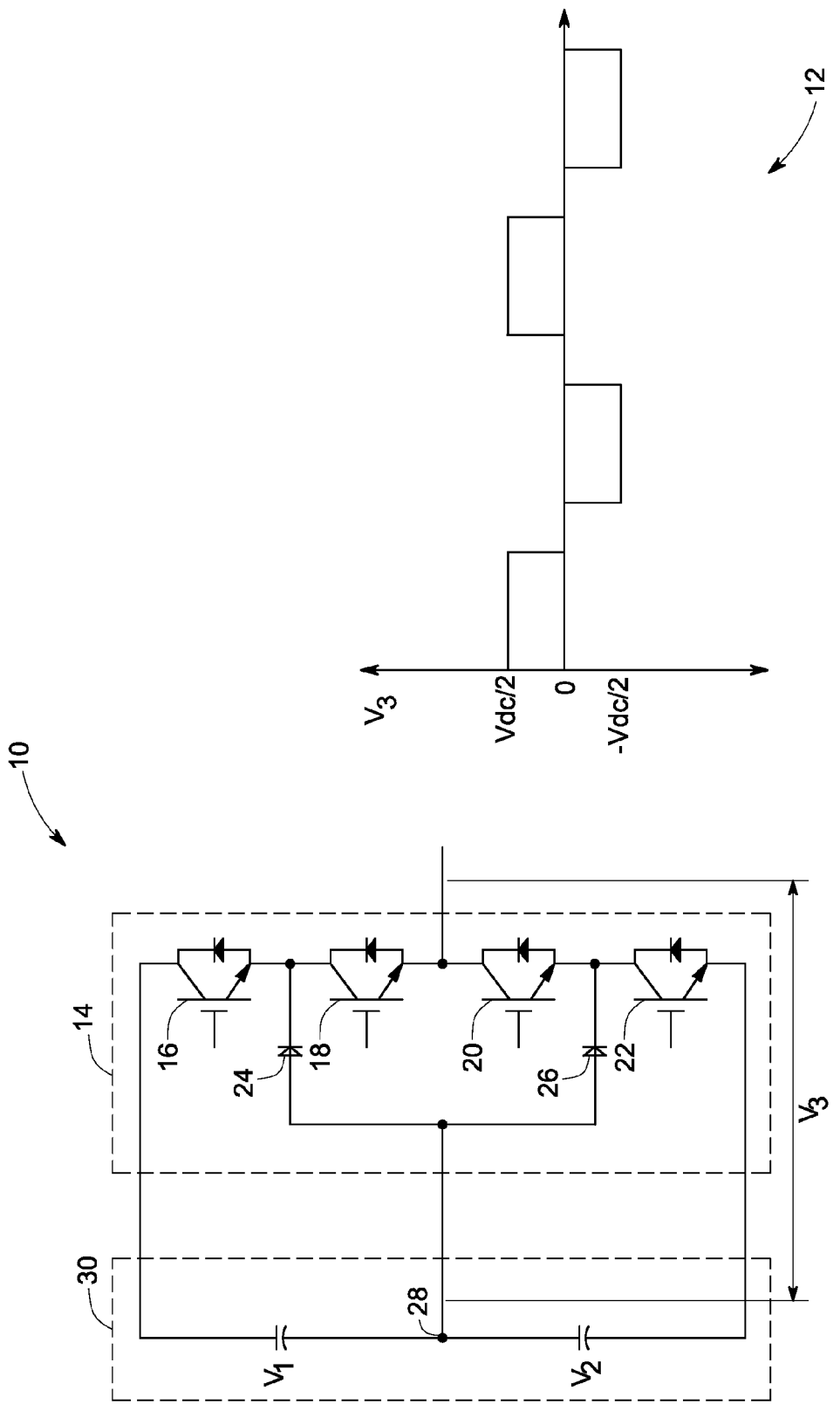
FIG. 1 is a circuit diagram of one leg of a conventional neutral point clamped multilevel converter and its output waveform.

As discussed in detail below, embodiments of the present invention enable a multilevel converter to convert a direct current (DC) power into an alternating current (AC) power with a switching device fault detection scheme. For example, in a three level Neutral Point Clamped (NPC) converter, a key failure mode exists when a switching device (16, 18, 20, or 22 of FIG. 1) or a clamping diode (24 or 26 of FIG. 1) fails short. Under this condition, one half of the DC link, V1 or V2 in FIG. 1, is charged to the peak line-to-line voltage of the machine or grid side voltage. This value is typically higher than the maximum allowed blocking voltage of the switching devices and the capacitors. In this case, other switching devices or clamping diodes may be stressed in terms of voltage or current beyond their capability. Hence, this will cause additional switching devices, in particular switching devices in phase legs connected to the same DC bus, to fail after the failure of the initial switching device. The switching device failure detection scheme of the present invention provides a suitable logic circuit to detect failures in switching devices and so prevents secondary damage of multilevel converters which may be used in applications such as a solar (or photovoltaic) power generation systems, wind turbine generators or marine and hydrokinetic power generation systems.

FIG. 1 illustrates a schematic 10 of one leg or one phase of a conventional neutral point clamped (NPC) or diode clamped three level converter and its output waveform 12. One leg 14 of the three-level converter includes four switching devices 16, 18, 20, and 22 and two clamping diodes 24 and 26. Input voltages V1 and V2 are controlled to each have a voltage equal to Vdc/2, where Vdc is the total DC link voltage. Voltage V3 is the phase A output voltage measured with respect to a center point 28 of DC link 30. Switching device 16 is complementary to switching device 20 so that, when switching device 16 is gated on, switching device 20 is gated off and vice versa. Similarly, switching devices 18 and 22 are complementary.

In operation, each leg of the NPC three level converter has three switching stages. In the first switching stage, switching devices 16 and 18 are turned on and switching devices 20 and 22 are turned off. Assuming a stable operation, V1=V2=Vdc/2, and V3 becomes Vdc/2. In the second switching stage, switching devices 18 and 20 are turned on while switching devices 16 and 22 are turned off. In this stage, V3 is equal to zero. In the third switching stage, switching devices 16 and 18 are turned off whereas switching devices 20 and 22 are turned on. This results in V3 becoming −Vdc/2 as shown in a waveform 12. Thus, it can be seen that the phase voltage V3 has three levels Vdc/2, −Vdc/2 and 0. When all three legs of the NPC three-phase converter are combined, then the resulting line to line voltages have five levels namely Vdc, Vdc/2, 0, −Vdc/2 and −Vdc. The three-level converter 14 of FIG. 1 may be increased to any level depending on the circuit topology and number of switching devices and diodes in the circuit. As the number of levels in the converter increases, the output waveform of the converter approaches a pure sine wave, resulting in lower harmonics in the output voltage. In general, the number of switching stages can be higher than three as switching devices may not be gated on if the corresponding free-wheeling diode is going to conduct current. This operation mode does not affect the number of levels of the output phase voltage.

Figure 2:
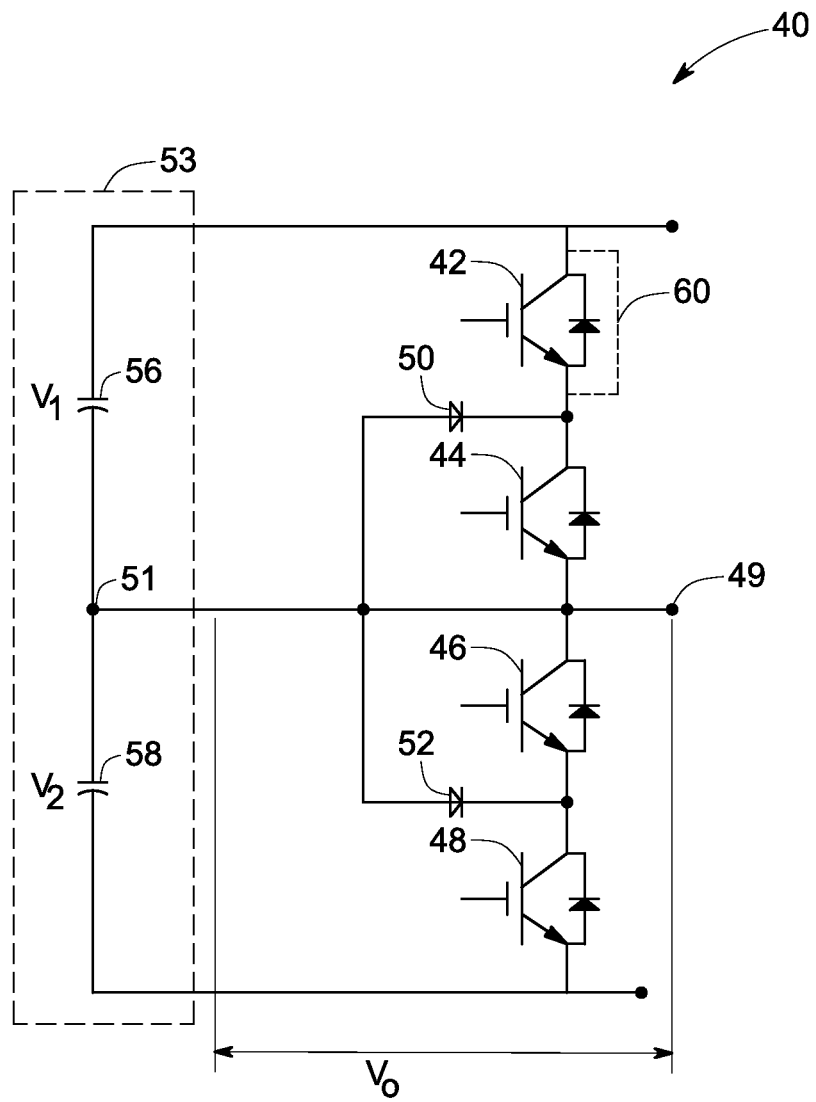
FIG. 2 is a representation of fault condition in a leg of a three phase three level NPC converter.

FIG. 2 shows a fault condition 60 in one leg 40 of a multilevel converter. As described earlier, each leg 40 of the converter includes two outer and two inner switching devices for example, 42, 48, and 44, 46 respectively. Further, leg 40 comprises two clamping diodes 50 and 52 and its output voltage V0 is measured between a center point 49 of leg 40 and a center point 51 of DC link 53. Leg 40 is connected to a split DC link 53 with a top capacitor 56 and a bottom capacitor 58. FIG. 2 shows outer switching device 42 of leg 40 failing short (represented by referral numeral 60). The condition may occur as a result of occurrences such as, for example, thermal breakdown of outer switching device 42, the voltage breakdown of outer switching device 42, failures due to cosmic rays, and failures due to weak manufacturing of the switching device. For example, when the bottom two switching devices 46, 48 are gated on with the goal of having Vo=−Vdc/2, the voltage that appears across inner switching device 44 will be the total DC link voltage i.e. Vdc, which could result in a failure for switching device 44.

Figure 3:
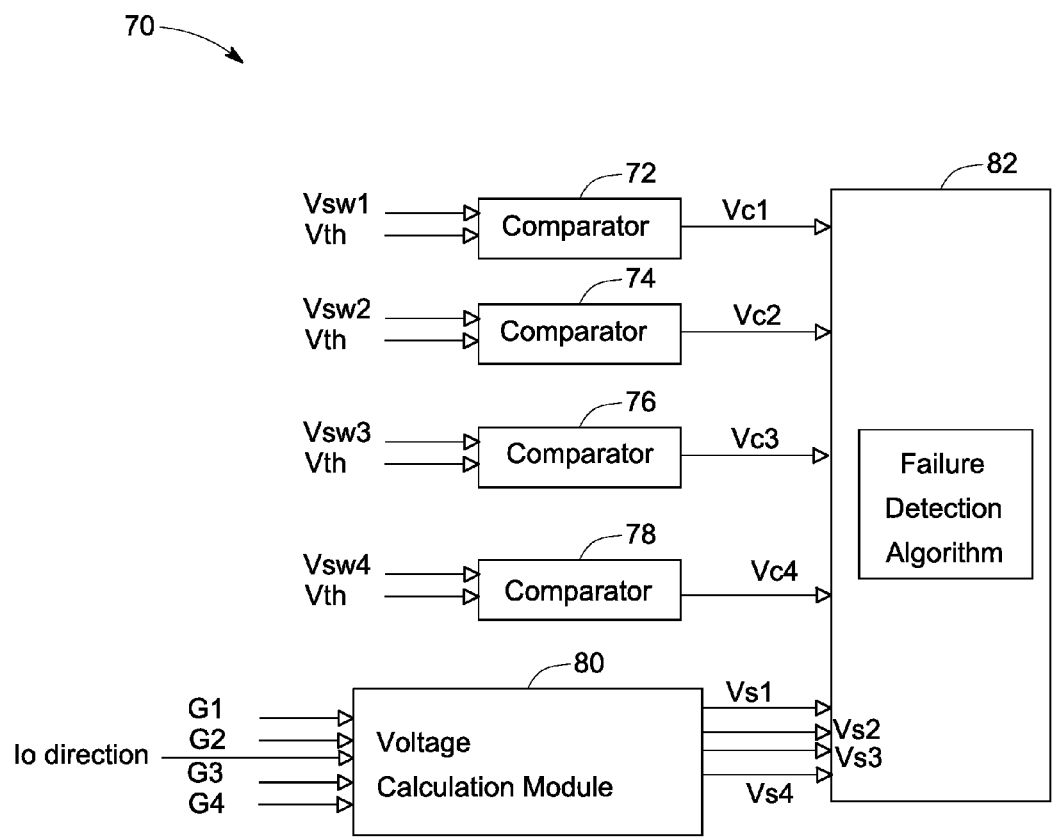
FIG. 3 is a switching device failure detection circuit, in accordance with an embodiment of the present invention.

FIG. 3 shows a switching device failure detection circuit 70 in accordance with an embodiment of the present invention. The circuit includes logic modules or comparators 72, 74, 76, and 78, each corresponding to a respective one of the switching devices 42, 44, 46, and 48 (FIG. 2). Switching device failure detection circuit 70 further includes a voltage calculation module 80, and a failure detection algorithm 82. Each comparator 72, 74, 76, and 78 compares two inputs, i) a switching device voltage i.e. a voltage across a switching device Vsw and ii) a threshold reference voltage Vth and provides an output voltage referred as blocking state logic signal Vc. In one embodiment, the threshold reference voltage Vth is set slightly higher than the rated voltage drop across the switching device when it is conducting. In another embodiment, this signal is typically already available from de-saturation detection circuit, e.g. in IGBT converters. In yet another embodiment, the threshold reference voltage Vth may be set to an arbitrary suitable level between the voltage in the previous embodiment i.e., slightly higher than the rated voltage drop across the switching device and the lower limit of Vdc/2. In one embodiment, the blocking state logic signal Vc is 'high' if Vsw is greater than Vth else it is 'low'. It should be noted that 'high' refers to the positive supply voltage of the comparator and 'low' refers to the negative supply voltage of the comparator. Thus, comparator 72 compares Vsw1 and Vth and outputs Vc1, where Vsw1 refers to voltage across switching device 42, comparator 74 compares voltage across switching device 44, Vsw2 and Vth and outputs Vc2. Similarly, comparator 76 compares Vsw3, which is voltage across switching device 46 and Vth, and outputs Vc3, and comparator 78 compares voltage across switching device 48, Vsw4 and Vth and outputs Vc4. In one embodiment, the comparator may be an open loop operational amplifier circuit or a dedicated voltage comparator integrated within a chip. In another embodiment, a portion of a desaturation circuit generally used in IGBT drivers, which provides a threshold voltage logic signal, may also be used as comparator.

Based on the gate signals of the switching devices 42, 44, 46 and 48 and an output current direction (i.e. Io direction), voltage calculation module 80 determines whether in the current switching stage, each switching device is suppose to block a voltage across its terminals or not. Outputs of voltage calculation module are expected voltage blocking states Vs1, Vs2, Vs3 and Vs4 for the switching devices that are input into switching device failure detection algorithm 82. An expected voltage Vexp at the output terminal points 49 and 51 of a leg of the multilevel converter during normal condition is calculated as an intermediate step in voltage calculation module 80. The expected voltage is determined based on the inputs such as gate drive signals G1, G2, G3, and G4 for switching devices 42, 44, 46, and 48 and the corresponding output current direction i.e., Io direction. The expected output voltage Vexp has three levels, positive, negative, and zero. Based on these levels, the gate drive signals and the output current direction the determination of whether a particular switching device should block the voltage or not is made and thus, the logic signals Vs1, Vs2, Vs3 and Vs4 are generated. If any of the logic signals is high, it indicates that the particular switching device should block the voltage else it should not. Switching device failure detection algorithm 82 then compares for each switching devices the information whether a device is actually blocking or not (i.e. Vc1, Vc2, Vc3, and Vc4) with the information whether each device should be blocking or not (i.e. Vs1, Vs2, Vs3, and Vs4) in the current switching stage. If actual blocking state and expected blocking state of any switching device do not match (for example if Vc1≠Vs1), a failure is detected.

The above switching device failure detection circuit 70 may be implemented in the analog domain, or the digital domain, or a combination thereof. Where digital circuitry is used for processing, the circuitry will generally include analog-to-digital conversion, although analog processing components will generally not require such conversion unless some processing is done in the digital domain. Examples of digital circuitry include digital components, such as a programmed microprocessor, field programmable gate array (FPGA), application specific digital signal processor (DSP) or the like. It should be noted that the particular order of processing as represented by the components shown in FIG. 3 may be altered, and other components may be included in the overall circuitry, where desired.

Figure 4:
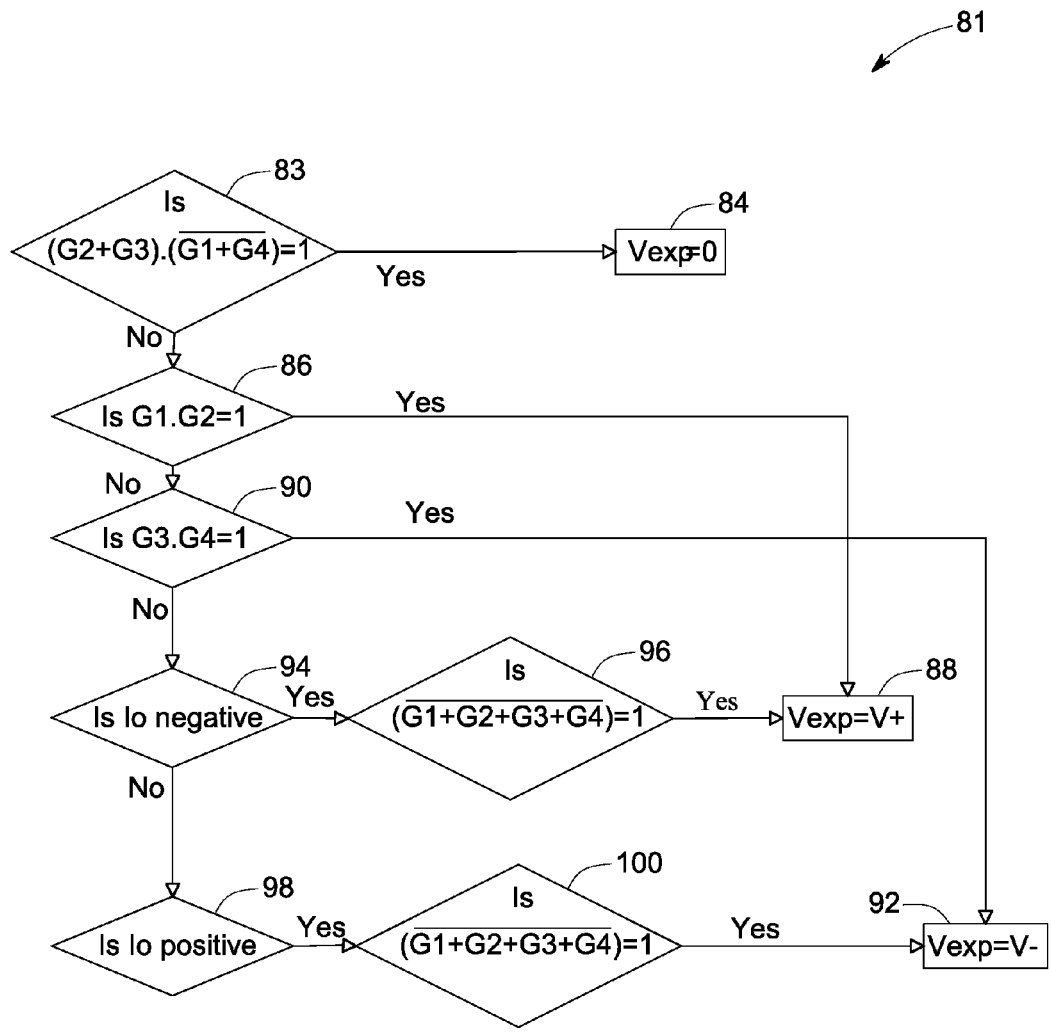
FIG. 4 is a diagrammatical representation of a voltage calculation module, in accordance with an embodiment of the present invention.

FIG. 4 shows one example implementation of expected voltage calculation module 81 for determining expected output voltage at the multilevel converter terminals. Module 81 receives inputs such as gate drive signals G1, G2, G3, and G4 for switching devices 42, 44, 46, and 48 respectively and also output current or Io direction. It should be noted the gate drive signal levels determine whether any switching device is ON or not. For example, if G2 or G3 is high, switching device 44 or 46 is ON respectively. Thus, for all the cases presented below if the switching device is ON, the corresponding gate drive signal is referred to as high. In first step 83, it is determined whether any one of inner switching devices 44 or 46 are ON and whether both outer switching devices 42 and 48 are OFF. In such a situation, one of clamping diodes 50 or 52 conducts, and thus expected voltage Vexp is equivalent to zero as represented by a block 84. This condition is represented in step 83 by a Boolean equation, $(G2+G3)\cdot(\overline{G1+G4})=1$. However, if this condition is not met, then in step 86, it is determined whether both top switching devices 42 and 44 are ON i.e., whether $G1 \cdot G2=1$. If both top switching devices are ON then expected voltage Vexp at the output terminals should be a positive voltage i.e. V+, represented by a block 88. If the condition checked in step 86 is not met, then step 90 determines whether both bottom switching devices 46 and 48 are ON i.e., whether $G3 \cdot G4=1$. Both bottom switching devices 46 and 48 being ON indicates that expected voltage Vexp should be a negative voltage i.e., V− represented by a block 92. If any of the conditions 83, 86 or 90 is not met, then output current (Io) direction helps in determining expected voltage Vexp. In step 94, it is determined whether output current Io is negative or not. If output current Io is negative, then in step 96 it is determined whether all switching devices 42, 44, 46, and 48 are OFF. This condition is represented in step 96 by $(\overline{G1+G2+G3+G4})=1$. If all switching devices are OFF and output current Io is negative, it indicates that freewheeling diodes of top two switching devices are conducting. Thus, expected voltage Vexp during this condition will be positive voltage V+, represented by block 88. If it is determined in step 94, that output current Io is not negative, then in step 98 it is determined whether the output current Io is positive or not. If output current Io is positive, in step 100, it is again determined whether all switching devices are OFF. If all switching devices are OFF and current direction is positive, it indicates that freewheeling diodes of bottom two switching devices are conducting and the expected voltage during this condition will be negative voltage V−.

Figure 5:
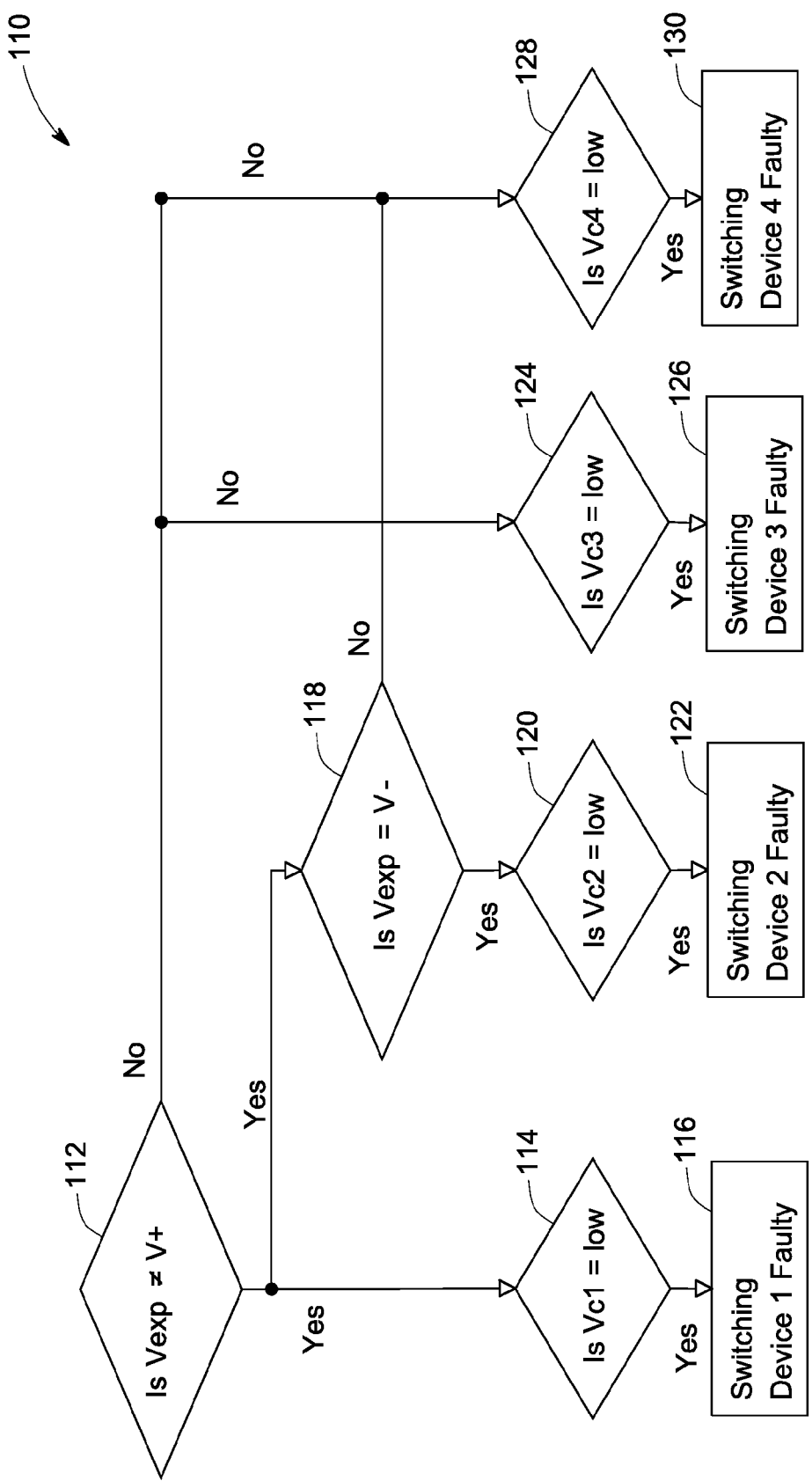
FIG. 5 is a failure detection algorithm in accordance with an embodiment of the present invention.

FIG. 5 shows a failure detection algorithm 110 in accordance with an embodiment of the present invention. Algorithm 110 determines whether any switching device that should block a DC voltage is actually not blocking DC voltage. In step 112 of algorithm 110, it is determined whether expected voltage Vexp is positive (V+) or not. If Vexp is not equal to V+, i.e., if Vexp is equal to negative voltage V− or zero voltage, then in step 114 it is checked whether blocking state logic signal Vc1 of first switching device 42 is low or high. If Vc1 is low then it indicates that switching device 42 is not blocking any voltage when actually it should block the voltage. The fault indication or the short circuit indication is then provided as shown in block 116. Another condition that is checked if Vexp is not equal to V+ is whether Vexp is negative voltage i.e., V−. If it is determined in step 118 that Vexp is indeed V-, then in step 120 it is checked whether blocking state logic signal Vc2 for switching device 44 is low. If Vc2 is low then second switching device 44 is considered to be faulty as shown in block 122. If it is determined in step 124 that Vexp is positive voltage i.e., V+, then in step 124, blocking state logic signal Vc3 for switching device 46 is compared with the low voltage. If it is found that Vc3 is low then it means switching device 46 is faulty as shown in block 126. Further, if Vexp is zero as determined from step 118 or positive as determined from step 112, then in step 128, it is checked whether blocking state logic signal Vc4 for switching device 48 is low. If Vc4 is low then it is indication of switching device 48 being faulty as shown in block 130. Thus, in this way with various combinations, failure conditions of switching devices are determined.

Figure 6:
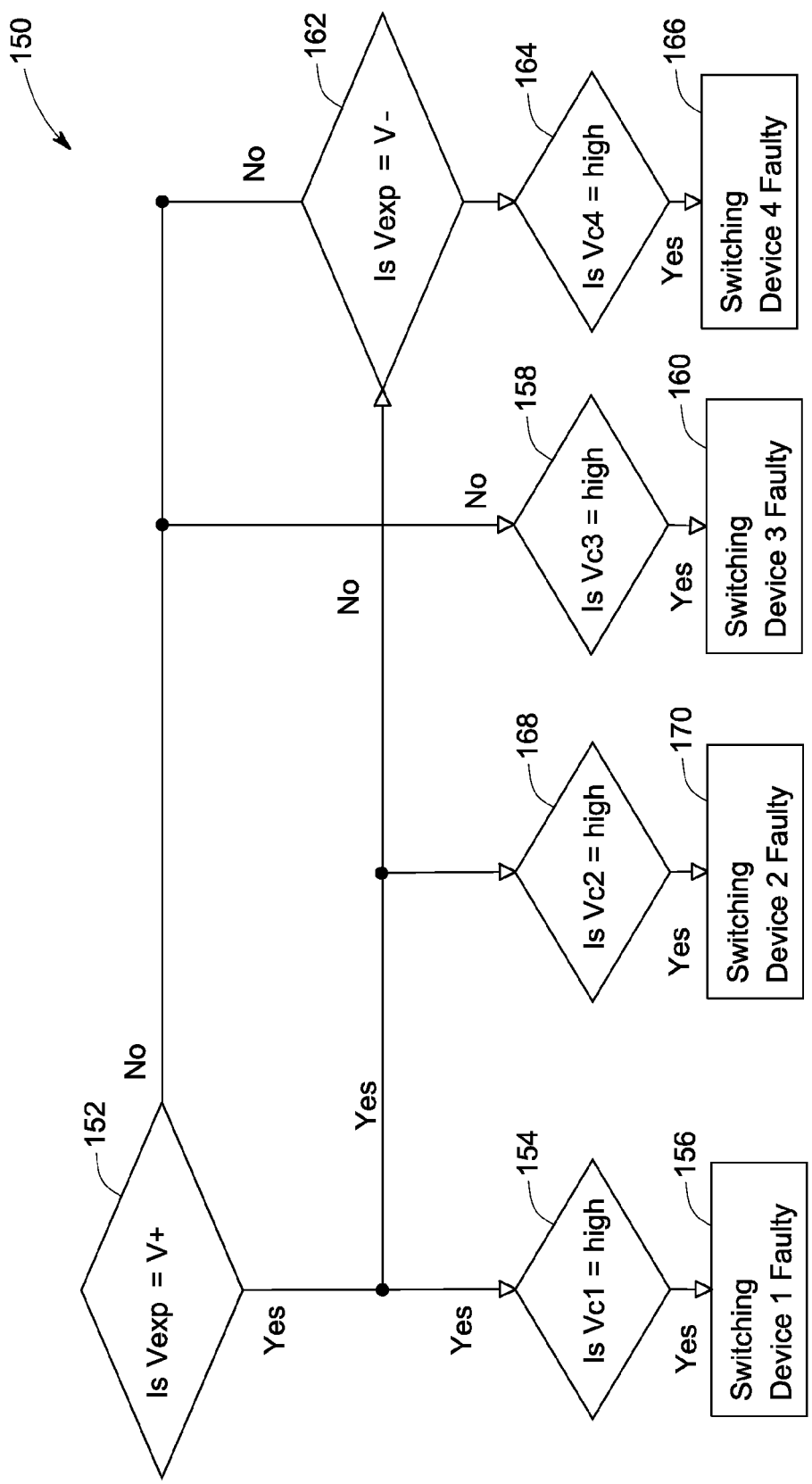
FIG. 6 is another failure detection algorithm in accordance with an embodiment of the present invention.

FIG. 6 shows another failure detection algorithm 150 in accordance with an embodiment of the present invention. Algorithm 150 is complementary to algorithm 110 i.e., it determines whether any switching device that is not expected to block any voltage is actually blocking the voltage. In step 152 of algorithm 150, it is determined whether expected voltage Vexp is positive (i.e., i.e., V+). If Vexp is positive, then it is checked in step 154 whether blocking state logic signal Vc1 of first switching device (42 of FIG. 2) is low or high. If Vc1 is high then it indicates that switching device 42 is faulty as shown in block 156. Further, if it is determined that Vexp is not positive i.e., either it is negative or zero, then it is checked whether blocking state logic signal Vc3 for switching device 46 is high or low in step 158, and, if it is determined that Vc3 is high, then that indicates switching device 46 is faulty as shown in block 160. It is checked from step 162 whether Vexp is negative i.e., V−, and, if yes, then it is determined from step 164 whether blocking state logic signal Vc4 for switching device 48 is high or low. If Vc4 is high then it indicates that switching device 48 is faulty as shown in block 166. Further, if it is determined from step 152 that Vexp is V+ or from step 162 that Vexp is zero, then it is checked in step 168, whether blocking state logic signal Vc2 for switching device 44 is high or not. If Vc2 turns out to be high, then it means switching device 44 is faulty as shown in block 170. It should be noted that the steps presented in FIG. 4, 5 or 6 are not restricted by their sequence. In one embodiment, some of the steps can be performed in parallel or in another embodiment; the sequence of the steps can be interchanged as long as it does not affect the final outcome.

Figure 7:
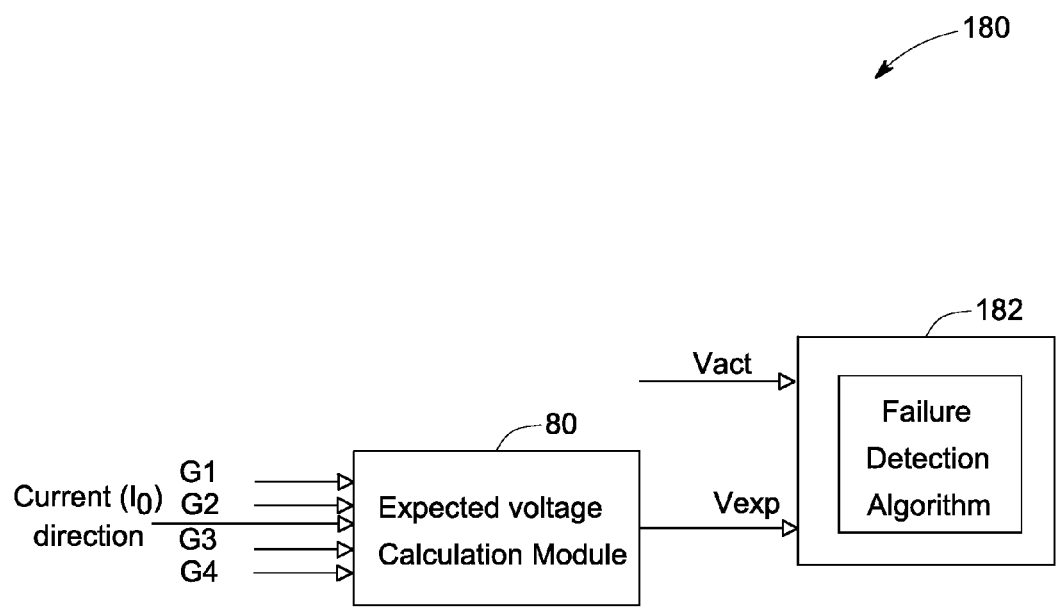
FIG. 7 is another switching device failure detection circuit, in accordance with an embodiment of the present invention.

FIG. 7 is another switching device failure detection circuit 180 in accordance with an embodiment of the present invention. Switching device failure detection circuit 180 utilizes voltage calculation module 80 described in FIG. 4. Circuit 180 further utilizes a failure detection algorithm 182 to detect failures in switching devices. Algorithm 182 compares expected voltage Vexp with actual voltage measured from multilevel converter leg output terminals. If there is mismatch it indicates failure of a switching device. For example, if Vexp is positive voltage and actual voltage is zero then it indicates that switching device 46 is short circuited. Thus, failure detection algorithm 182 detects failures in various switching devices.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A multilevel converter comprising:
   a plurality of phase legs each having at least two inner switching devices, at least two outer switching devices, at least two clamping diodes and a split DC link; and
   a switching device failure detection circuit comprising
   a logic module for each of the switching devices to generate a blocking state logic signal by comparing a switching device voltage and a threshold reference voltage;
   a voltage calculation module to determine an expected voltage blocking state for each of the switching devices based on the gate drive signals of the switching devices and an output current direction;
   a failure detection algorithm to detect a failure condition in any of the switching devices based on the blocking state logic signals and the expected voltage blocking states of the switching devices.

2. The multilevel converter of claim 1, wherein the threshold reference voltage is higher than a rated voltage drop across the switching device.

3. The multilevel converter of claim 1, wherein the threshold reference voltage is between a rated voltage drop across the switching device and half the DC link voltage.

4. The multilevel converter of claim 1, wherein voltage calculation module determines an expected output voltage at the multilevel converter output terminals, and wherein one of the inner switching devices comprises a top inner switching device, another of the inner switching devices comprises a bottom inner switching device, one of the outer switching devices comprises a top outer switching device, and another of the outer switching devices comprises a bottom outer switching device.

5. The multilevel converter of claim 4, wherein the expected output voltage is a zero voltage when the gate drive signals for any one of the inner switching devices are high and the gate drive signals for both the outer switching devices are low.

6. The multilevel converter of claim 4, wherein the expected output voltage is a positive voltage when the gate drive signals for both top inner and outer switching devices are high or when the output current direction is negative and the gate drive signals for all the switching devices are low.

7. The multilevel converter of claim 4, wherein the expected output voltage is a negative voltage when the gate drive signals for both the bottom inner and outer switching devices are high or when the output current direction is positive and the gate drive signals for all the switching devices are low.

8. The multilevel converter of claim 4, wherein the failure detection algorithm detects the failure condition in the top outer switching device when the expected output voltage is not positive and the blocking state logic signal for the top outer switching device is low.

9. The multilevel converter of claim 4, wherein the failure detection algorithm detects the failure condition in the top inner switching device when the expected output voltage is negative and the blocking state logic signal for the top inner switching device is low.

10. The multilevel converter of claim 4, wherein the failure detection algorithm detects the failure condition in the bottom inner switching device when the expected output voltage is positive and the blocking state logic signal for the bottom inner switching device is low.

11. The multilevel converter of claim 4, wherein the failure detection algorithm detects the failure condition in the bottom outer switching device when the expected output voltage is not negative and the blocking state logic signal for the bottom outer switching device is low.

12. The multilevel converter of claim 4, wherein the failure detection algorithm detects the failure condition in the top outer switching device when the expected output voltage is positive and the blocking state logic signal for the top outer switching device is high.

13. The multilevel converter of claim 4, wherein the failure detection algorithm detects the failure condition in the top inner switching device when the expected output voltage is not negative and the blocking state logic signal for the top inner switching device is high.

14. The multilevel converter of claim 4, wherein the failure detection algorithm detects the failure condition in the bottom inner switching device when the expected output voltage is not positive and the blocking state logic signal for the bottom inner switching device is high.

15. The multilevel converter of claim 4, wherein the failure detection algorithm detects the failure condition in the bottom outer switching device when the expected output voltage is negative and the blocking state logic signal for the bottom outer switching device is high.

16. A multilevel converter comprising:
   a plurality of phase legs each having at least two inner switching devices, at least two outer switching devices, at least two clamping diodes and a split DC link; and
   a switching device failure detection circuit comprising
   a voltage calculation module to determine an expected output voltage at phase terminals of phase legs based on gate drive signals of switching devices and an output current direction;
   a failure detection algorithm to detect a failure condition in any of the switching devices by comparing the expected output voltage with an actual output voltage.

* * * * *